United States Patent
Shu et al.

(10) Patent No.: US 8,158,893 B2
(45) Date of Patent: Apr. 17, 2012

(54) ELECTRONIC DEVICE AND EMI/ESD PROTECTION MODULE THEREOF

(75) Inventors: Chung-Won Shu, Taipei (TW); Chih-Heng Chiu, Taipei (TW); Din-Ji Tzou, Taipei (TW); Chung-Wen Huang, Taipei County (TW)

(73) Assignee: Transcend Information, Inc., NeiHu Dist, Taipei (TW)

( * ) Notice: Subject to any disclaimer, the term of this patent is extended or adjusted under 35 U.S.C. 154(b) by 337 days.

(21) Appl. No.: 12/699,880

(22) Filed: Feb. 4, 2010

(65) Prior Publication Data

US 2011/0162878 A1 Jul. 7, 2011

(30) Foreign Application Priority Data

Jan. 7, 2010 (TW) ................. 99100263 A

(51) Int. Cl.
*H05K 9/00* (2006.01)
(52) U.S. Cl. ........ 174/352; 174/377; 174/366; 361/220; 361/818
(58) Field of Classification Search ........... 174/352, 174/377, 366; 361/220, 818; 439/607.17, 439/607.19
See application file for complete search history.

(56) References Cited

U.S. PATENT DOCUMENTS

| | | | | | |
|---|---|---|---|---|---|
| 5,671,123 | A | * | 9/1997 | Omori et al. | 361/737 |
| 6,080,930 | A | * | 6/2000 | Lommen et al. | 174/355 |
| 6,596,936 | B2 | * | 7/2003 | Deguchi | 174/352 |
| 6,671,160 | B2 | * | 12/2003 | Hayden | 361/212 |
| 7,135,644 | B1 | * | 11/2006 | Gilliland et al. | 174/383 |
| 7,522,401 | B2 | * | 4/2009 | Dela Cruz et al. | 361/220 |
| 7,692,932 | B2 | * | 4/2010 | Bisbikis et al. | 361/799 |
| 2008/0037212 | A1 | | 2/2008 | Wang | |
| 2008/0271916 | A1 | * | 11/2008 | Ball | 174/355 |
| 2009/0114437 | A1 | * | 5/2009 | Tuen et al. | 174/350 |

FOREIGN PATENT DOCUMENTS

TW M247897 10/2004

* cited by examiner

*Primary Examiner* — Hung Ngo
(74) *Attorney, Agent, or Firm* — Winston Hsu; Scott Margo

(57) ABSTRACT

An EMI/ESD protection module is disposed between a first metal connecting member and a second metal connecting member. The EMI/ESD protection module includes a first conductive member, a second conductive member and a resilient member. The first conductive member is electrically connected to the first metal connecting member. The second conductive member is movably connected to the first conductive member and electrically connected to the second metal connecting member. The resilient member is disposed between the first and second conductive members.

15 Claims, 7 Drawing Sheets

ELECTRONIC DEVICE AND EMI/ESD PROTECTION MODULE THEREOF

BACKGROUND OF THE INVENTION

1. Field of the Invention

The invention relates to an Electromagnetic Interference (EMI)/Electrostatic Discharge (ESD) protection module and, more particularly, to an EMI/ESD protection module capable of being assembled easily and applied widely in all kinds of electronic devices.

2. Description of the Prior Art

At present, many electronic devices are getting size down and multifunctional. The inner space of the electronic devices is limited with the size down of the electronic devices. In this case, the circuit board of the electronic device is getting smaller and the frequency of processing data is getting higher. Therefore, the EMI is getting worse due to electromagnetic effect of the circuit board. Because the circuit layout of the circuit board is more precise to make ESD occur frequently due to the friction between the surface of the circuit board and the air. EMI/ESD may affect the function of the circuit board to make the system unstable or crash.

The present electronic devices are equipped with some components for EMI/ESD protection, such as conductive foil, conductive fabric, conductive foam, etc. to derive electric charges generated from the circuit board so as to maintain normal function. However, when using the conductive fabric, conductive foil, conductive foam, etc. to make electrical connection in an area with long distance or height, it often results in difficult construction, poor yielding rate, or even short circuit and so on.

SUMMARY OF THE INVENTION

Therefore, an objective of the invention is to provide an EMI/ESD protection module capable of being assembled easily and applied widely in all kinds of electronic devices.

According to one embodiment, an EMI/ESD protection module of the invention is disposed between a first metal connecting member and a second metal connecting member. The EMI/ESD protection module comprises a first conductive member, a second conductive member and a resilient member. The first conductive member is electrically connected to the first metal connecting member. The second conductive member is movably connected to the first conductive member and electrically connected to the second metal connecting member. The resilient member is disposed between the first conductive member and the second conductive member.

According to another embodiment, an electronic device of the invention comprises a casing, a first metal connecting member, a second metal connecting member, and an EMI/ESD protection module. The casing comprises a first bracket and a second bracket disposed opposite to the first bracket. The first metal connecting member is disposed in the first bracket. The second metal connecting member is disposed in the second bracket. The EMI/ESD protection module is disposed between the first bracket and the second bracket. The EMI/ESD protection module comprises a first conductive member, a second conductive member and a resilient member. The first conductive member is electrically connected to the first metal connecting member. The second conductive member is movably connected to the first conductive member and electrically connected to the second metal connecting member. The resilient member is disposed between the first conductive member and the second conductive member.

As mentioned in the above, the invention utilizes modular EMI/ESD protection module to achieve electrical connection. The invention utilizes the resilient member to adjust the distance between the first conductive member and the second conductive member, such that the EMI/ESD protection module is capable of being assembled easily and applied widely in all kinds of electronic devices. Furthermore, the invention can adjust contact pressure by changing elastic coefficient of the resilient member, so as to reduce contact resistance and enhance support strength.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
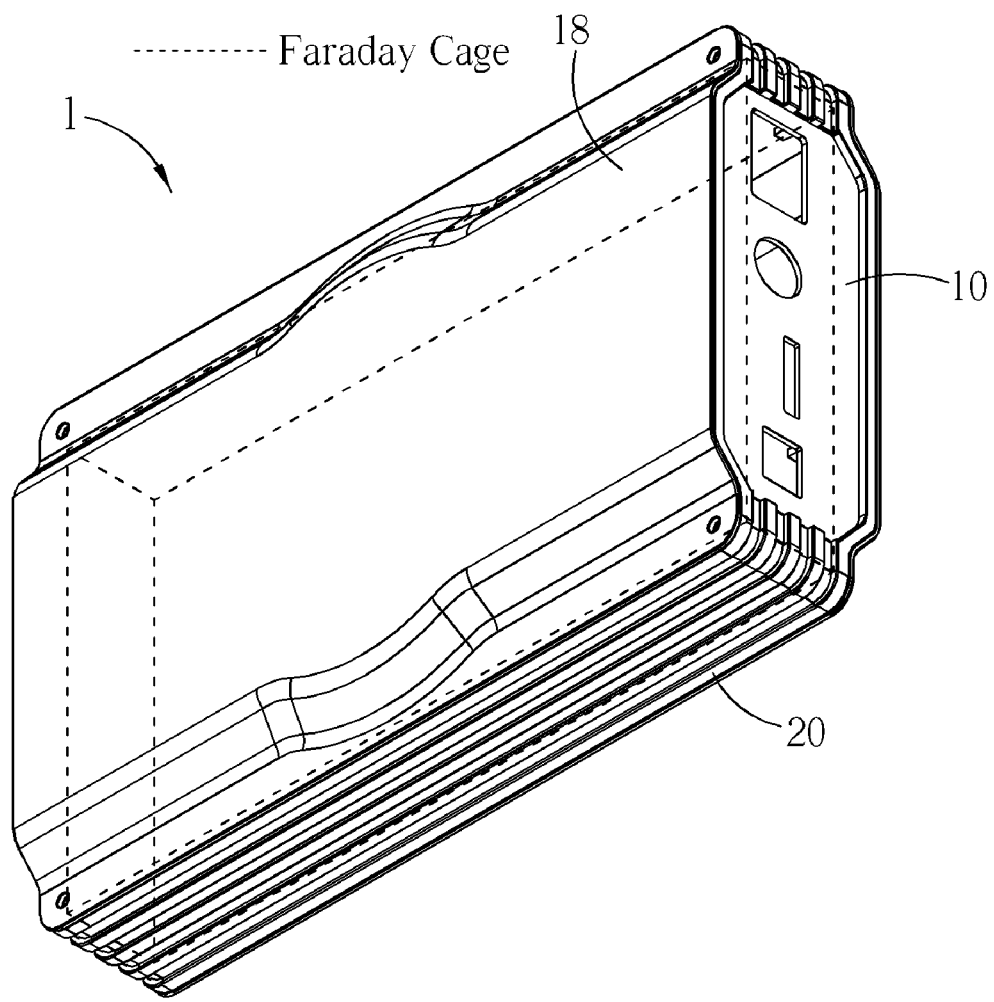
FIG. 1 is a perspective view illustrating an electronic device according to one embodiment of the invention.
Figure 2:
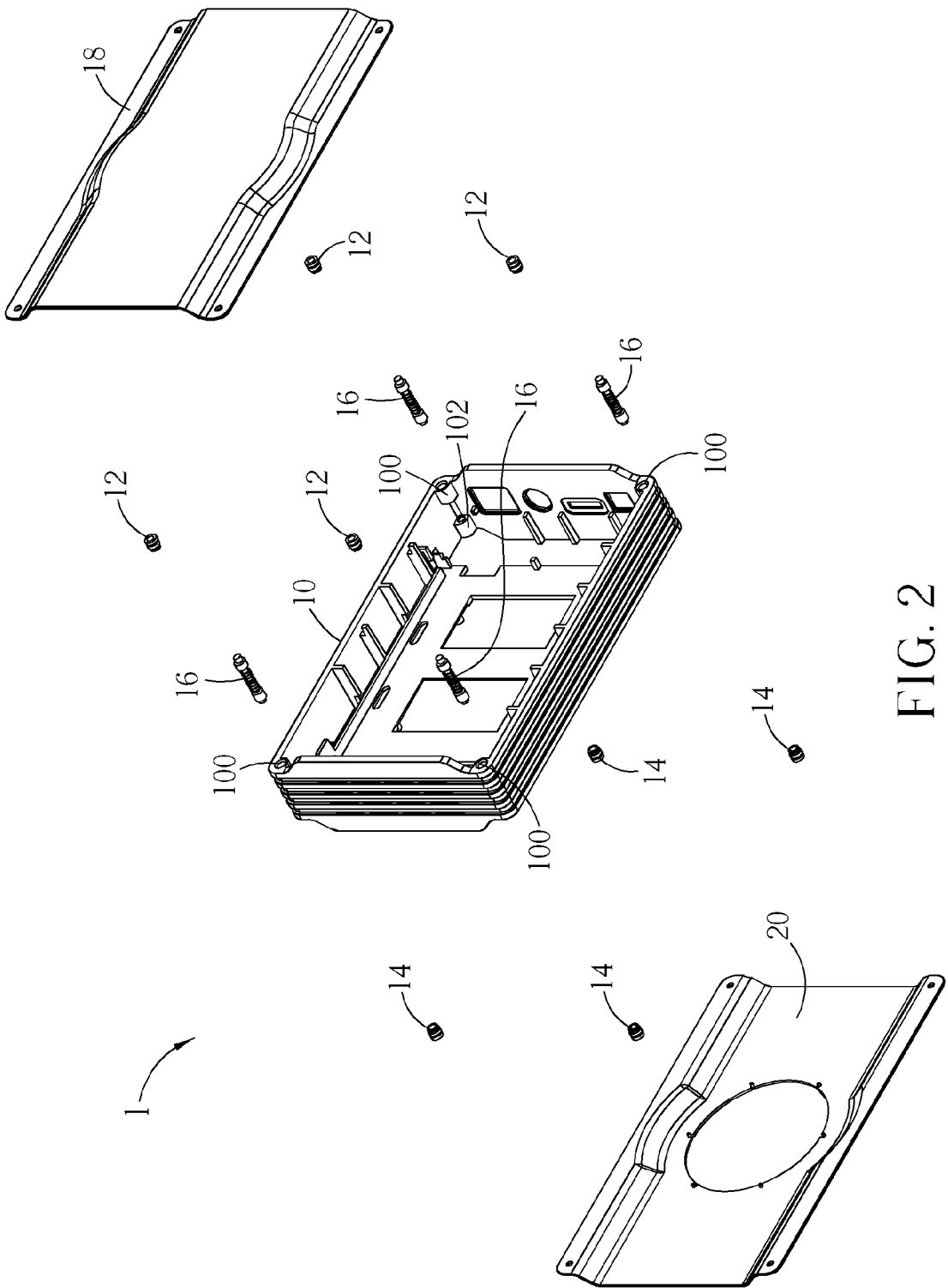
FIG. 2 is an exploded view illustrating the electronic device in FIG. 1.

Referring to FIG. 1 and FIG. 2, FIG. 1 is a perspective view illustrating an electronic device 1 according to one embodiment of the invention, and FIG. 2 is an exploded view illustrating the electronic device 1 in FIG. 1. As shown in FIG. 1 and FIG. 2, the electronic device 1 comprises a casing 10, four first metal connecting members 12, four second metal connecting members 14, four EMI/ESD protection modules 16, a first metal cover 18 and a second metal cover 20. Each of four corners of the casing 10 has a first bracket 100 and a second bracket 102 disposed opposite to the first bracket 100. It should be noted that FIG. 2 only shows one second bracket 102 on a corner of the casing 10 due to view angle.

In this embodiment, the casing 10 can be made of plastic, and the first metal connecting member 12 and the second metal connecting member 14 can be copper pillars respectively. In practical application, the first metal connecting member 12 and the second metal connecting member 14 are disposed in the first bracket 100 and the second bracket 102 respectively by hot-melt process. The first metal cover 18 and the second metal cover 20 are respectively fixed to the first metal connecting member 12 and the second metal connecting member 14 by screws or other fixing components so as to fix the first metal cover 18 and the second metal cover 20 on the casing 10.

Figure 3:
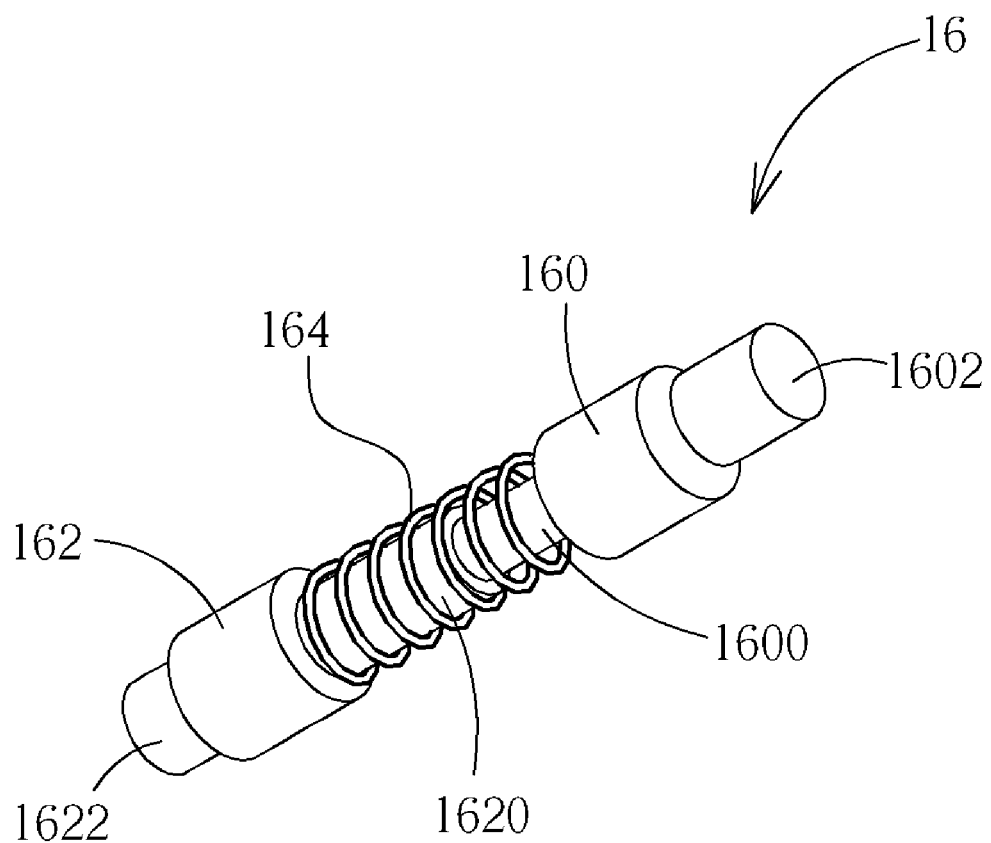
FIG. 3 is an enlarged view illustrating the EMI/ESD protection module in FIG. 2.
Figure 4:
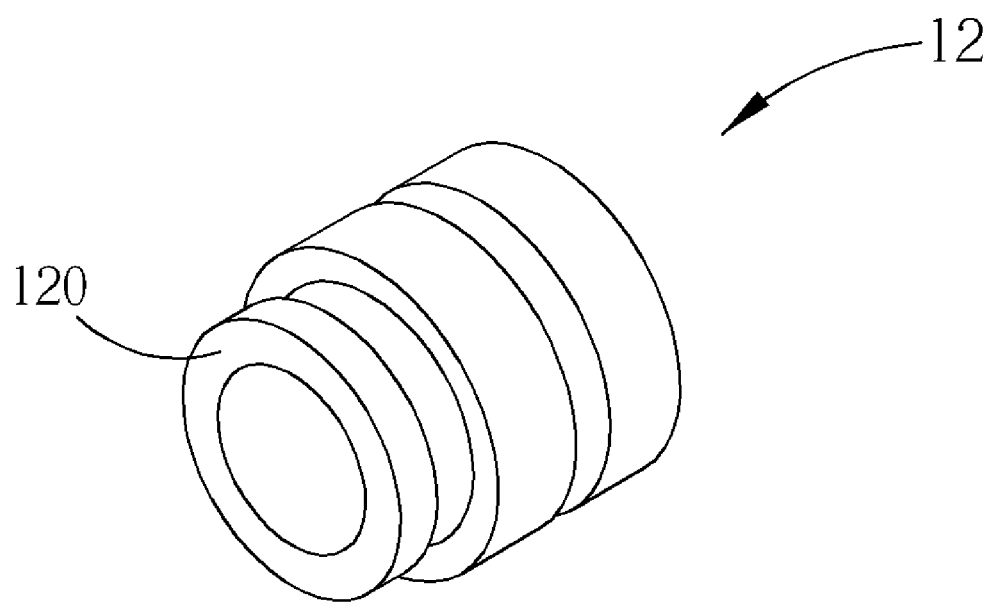
FIG. 4 is an enlarged view illustrating the first metal connecting member in FIG. 2.

Referring to FIG. 3, FIG. 3 is an enlarged view illustrating the EMI/ESD protection module 16 in FIG. 2. In this embodiment, the EMI/ESD protection module 16 is disposed between the first bracket 100 and the second bracket 102. As shown in FIG. 3, the EMI/ESD protection module 16 comprises a first conductive member 160, a second conductive member 162 and a resilient member 164, wherein the first conductive member 160 and the second conductive member 162 can be made of metal, and the resilient member 164 can be a spring. The first conductive member 160 comprises a first connecting portion 1600, and the second conductive member 162 comprises a second connecting portion 1620. In this embodiment, the first connecting portion 1600 can be a shaft, and the second connecting portion 1620 can be a sleeve. The first connecting portion 1600 can be disposed in the second connecting portion 1620, such that the second connecting portion 1620 can move back and forth with respect to the first connecting portion 1600. Simultaneously, the first conductive member 160 is electrically connected to the second conductive member 162. Besides, the resilient member 164 is disposed on the first connecting portion 1600 and the second connecting portion 1620. When the first conductive member 160 and the second conductive member 162 are compressed by a force, the resilient member 164 will be also compressed to generate an elastic force.

Figure 5:
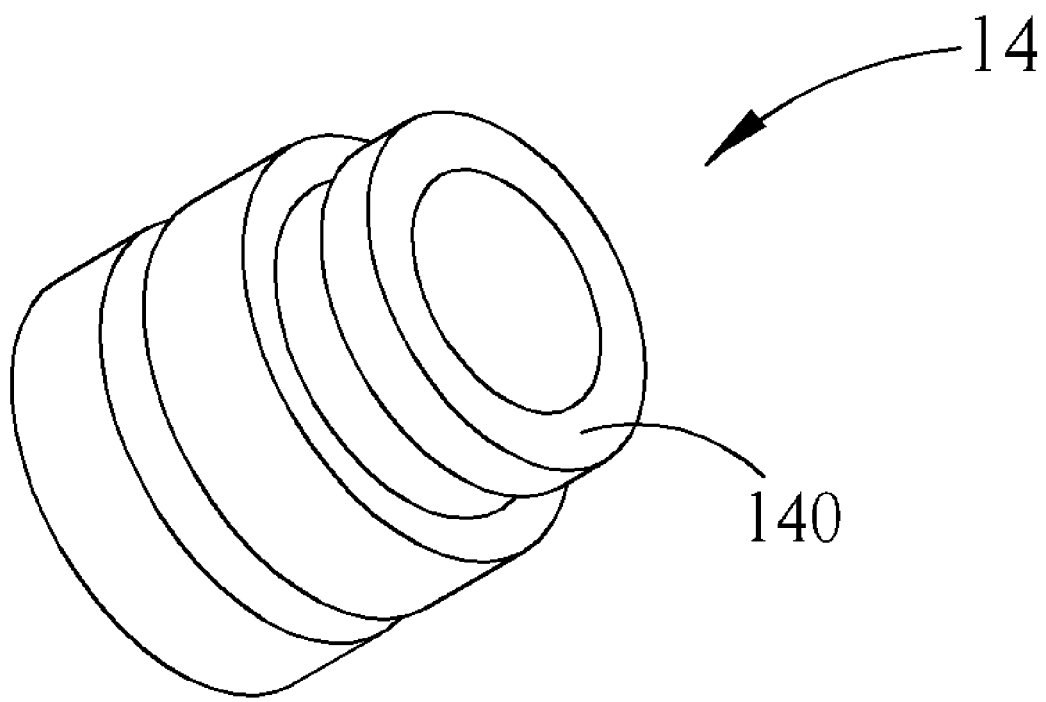
FIG. 5 is an enlarged view illustrating the second metal connecting member in FIG. 2.
Figure 6:
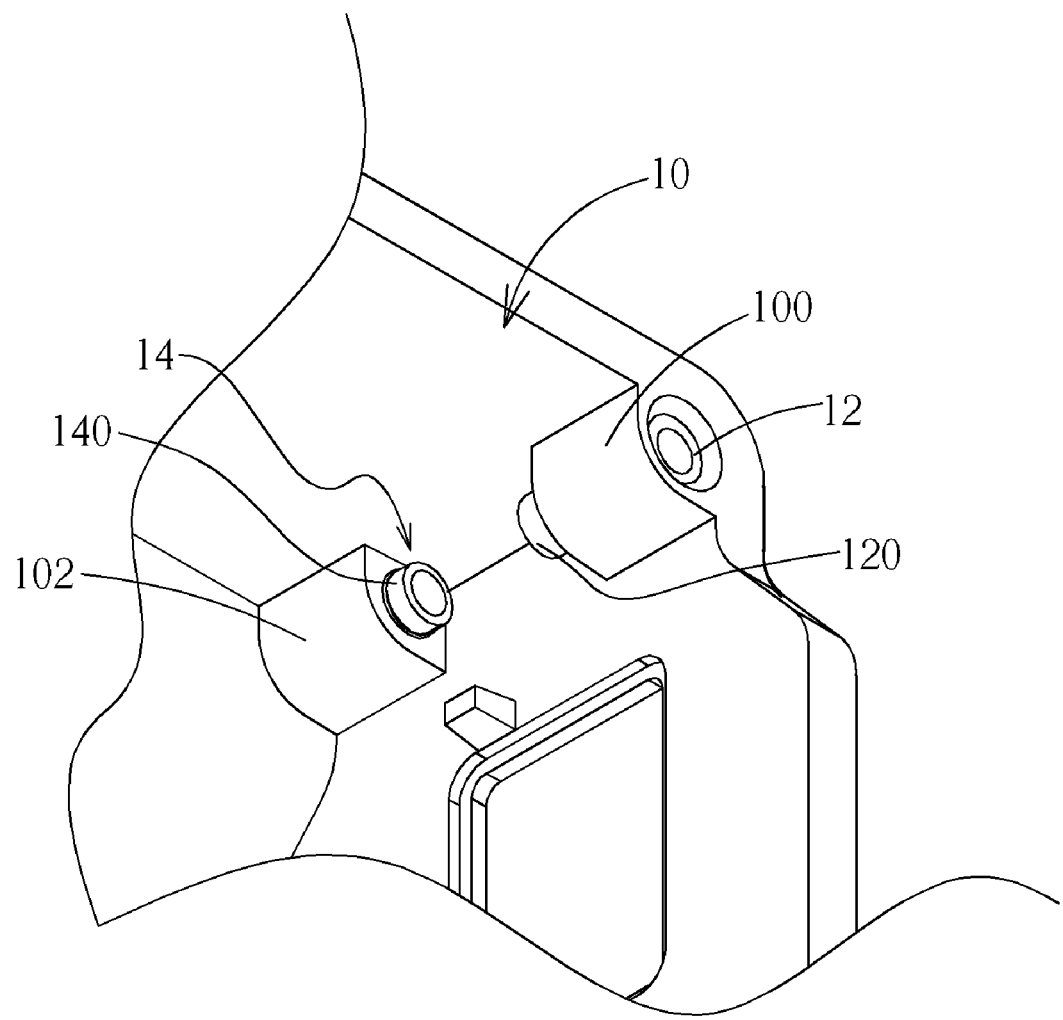
FIG. 6 is a schematic diagram illustrating the first metal connecting member and the second metal connecting member disposed in the first bracket and the second bracket respectively in FIG. 2.
Figure 7:
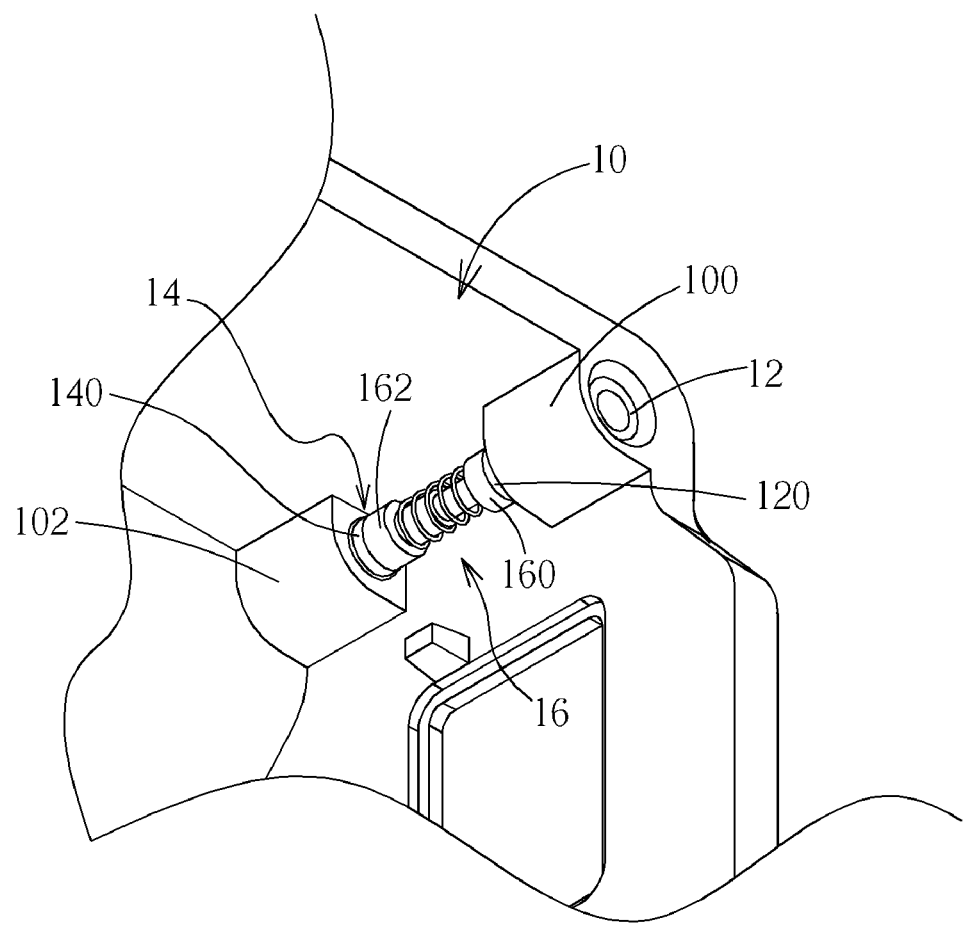
FIG. 7 is a schematic diagram illustrating the EMI/ESD protection module disposed between the first bracket and the second bracket.

Referring to FIG. 4 to FIG. 7, FIG. 4 is an enlarged view illustrating the first metal connecting member 12 in FIG. 2, FIG. 5 is an enlarged view illustrating the second metal connecting member 14 in FIG. 2, FIG. 6 is a schematic diagram illustrating the first metal connecting member 12 and the second metal connecting member 14 disposed in the first bracket 100 and the second bracket 102 respectively in FIG. 2, and FIG. 7 is a schematic diagram illustrating the EMI/ESD protection module 16 disposed between the first bracket 100 and the second bracket 102. Referring to FIG. 3 along with FIG. 4 and FIG. 5, the first metal connecting member 12 comprises a first engaging portion 120, a first conductive member 160 comprises a second engaging portion 1602, the second metal connecting member 14 comprises a third engaging portion 140, and the second conductive member 162 comprises a forth engaging portion 1622.

As shown in FIG. 6, when the first metal connecting member 12 and the second metal connecting member 14 are disposed in the first bracket 100 and the second bracket 102 respectively, the first engaging portion 120 is exposed out of the first bracket 100 and the third engaging portion 140 is exposed out of the second bracket 102. In this embodiment, the first engaging portion 120 and the third engaging portion 140 comprise a hole respectively, and the second engaging portion 1602 and the forth engaging portion 1622 comprise a pillar respectively. When a user wants to assemble the EMI/ESD protection module 16 to the casing 10, he or she needs to press the first conductive member 160 and the second conductive member 162 and then puts the EMI/ESD protection module 16 to the gap between the first bracket 100 and the second bracket 102. After releasing the force, the resilient member 164 pushes the first conductive member 160 and the second conductive member 162 toward the first bracket 100 and the second bracket 102, such that the second engaging portion 1602 and the fourth engaging portion 1622 engage with the first engaging portion 120 and the third engaging portion 140 respectively. Simultaneously, the first conductive member 160 is electrically connected to the first metal connecting member 12, and the second conductive member 162 is electrically connected to the second metal connecting member 14.

When each of four corners of the casing 10 is equipped with the EMI/ESD protection module 16 of the invention, the four corners of the casing 10 are electrically connected to the first metal cover 18 and the second metal cover 20 to form a Faraday Cage, as shown in dotted lines in FIG. 1. Therefore, it enhances the protection of the EMI/ESD.

Furthermore, a user just needs to press the first conductive member 160 and the second conductive member 162 to make the second engaging portion 1602 and the fourth engaging portion 1622 detach from the first engaging portion 120 and the third engaging portion 140, so as to detach the EMI/ESD protection module 16 from the casing 10. In another embodiment, the first engaging portion 120 and the third engaging portion 140 can also be pillars, and the second engaging portion 1602 and the fourth engaging portion 1622 can also be holes correspondingly. In other words, any engaging or fixing structure can be utilized in this invention to make the first conductive member 160 and the second conductive member 162 be electrically connected to the first metal connecting member 12 and the second metal connecting member 14 respectively.

Compared to the prior art, the invention utilizes the modular EMI/ESD protection module to achieve electrical connection. The invention utilizes the resilient member to adjust the distance between the first conductive member and the second conductive member, such that the EMI/ESD protection module is capable of being assembled easily and applied widely in all kinds of electronic devices. Furthermore, the invention can adjust contact pressure by changing elastic coefficient of the resilient member, so as to reduce contact resistance and enhance support strength.

Those skilled in the art will readily observe that numerous modifications and alterations of the device and method may be made while retaining the teachings of the invention.

What is claimed is:

1. An EMI/ESD protection module disposed between a first metal connecting member and a second metal connecting member, the EMI/ESD protection module comprising:
   a first conductive member electrically connected to the first metal connecting member;
   a second conductive member movably connected to the first conductive member and electrically connected to the second metal connecting member; and
   a resilient member disposed between the first conductive member and the second conductive member.

2. The EMI/ESD protection module of claim 1, wherein the first metal connecting member comprises a first engaging portion, the first conductive member comprises a second engaging portion, and the second engaging portion is detachably engaged with the first engaging portion.

3. The EMI/ESD protection module of claim 1, wherein the second metal connecting member comprises a third engaging portion, the second conductive member comprises a fourth engaging portion, and the fourth engaging portion is detachably engaged with the third engaging portion.

4. The EMI/ESD protection module of claim 1, wherein the first conductive member comprises a first connecting portion, the second conductive member comprises a second connecting portion, and the second connecting portion is movably connected to the first connecting portion.

5. The EMI/ESD protection module of claim 4, wherein the resilient member is disposed on the first connecting portion and the second connecting portion.

6. The EMI/ESD protection module of claim 1, wherein the resilient member is a spring.

7. An electronic device comprising:
   a casing comprising a first bracket and a second bracket disposed opposite to the first bracket;
   a first metal connecting member disposed in the first bracket;
   a second metal connecting member disposed in the second bracket; and an EMI/ESD protection module disposed between the first bracket and the second bracket, the EMI/ESD protection module comprising:
   a first conductive member electrically connected to the first metal connecting member;
   a second conductive member movably connected to the first conductive member and electrically connected to the second metal connecting member; and
   a resilient member disposed between the first conductive member and the second conductive member.

8. The electronic device of claim 7, wherein the first metal connecting member comprises a first engaging portion, the first engaging portion is exposed to the first bracket, the first conductive member comprises a second engaging portion, and the second engaging portion is detachably engaged with the first engaging portion.

9. The electronic device of claim 7, wherein the second metal connecting member comprises a third engaging portion, the third engaging portion is exposed to the second bracket, the second conductive member comprises a fourth engaging portion, and the fourth engaging portion is detachably engaged with the third engaging portion.

10. The electronic device of claim 7, wherein the first conductive member comprises a first connecting portion, the second conductive member comprises a second connecting portion, the second connecting portion is movably connected to the first connecting portion.

11. The electronic device of claim 10, wherein the resilient member is disposed between the first connecting portion and the second connecting portion.

12. The electronic device of claim 7, wherein the resilient member is a spring.

13. The electronic device of claim 7, wherein the casing is made of plastic.

14. The electronic device of claim 7, wherein the first metal connecting member and the second metal connecting member are copper pillars respectively.

15. The electronic device of claim 7 further comprising:
   a first metal cover fixed on the casing by the first metal connecting member; and
   a second metal cover fixed on the casing by the second metal connecting member.

* * * * *